United States Patent
Goela et al.

(10) Patent No.: US 9,228,257 B2
(45) Date of Patent: Jan. 5, 2016

(54) QUALITY MULTI-SPECTRAL ZINC SULFIDE

(75) Inventors: Jitendra S. Goela, Andover, MA (US); Nathaniel E. Brese, Hopkinton, MA (US)

(73) Assignee: ROHM AND HAAS COMPANY, Philadelphia, PA (US)

(*) Notice: Subject to any disclaimer, the term of this patent is extended or adjusted under 35 U.S.C. 154(b) by 665 days.

(21) Appl. No.: 13/446,272

(22) Filed: Apr. 13, 2012

(65) Prior Publication Data

US 2012/0302141 A1    Nov. 29, 2012

Related U.S. Application Data

(60) Provisional application No. 61/489,380, filed on May 24, 2011.

(51) Int. Cl.
| | |
|---|---|
| C23C 16/30 | (2006.01) |
| C01G 9/08 | (2006.01) |
| C04B 35/547 | (2006.01) |
| C04B 35/645 | (2006.01) |
| C23C 14/06 | (2006.01) |
| C23C 14/35 | (2006.01) |
| G02B 1/10 | (2015.01) |
| G02B 1/02 | (2006.01) |

(52) U.S. Cl.
CPC .............. C23C 16/306 (2013.01); C01G 9/08 (2013.01); C04B 35/547 (2013.01); C04B 35/6455 (2013.01); C23C 14/0629 (2013.01); C23C 14/357 (2013.01); G02B 1/10 (2013.01); C04B 2235/6565 (2013.01); C04B 2235/6567 (2013.01); C04B 2235/72 (2013.01); C04B 2235/9653 (2013.01); G02B 1/02 (2013.01)

(58) Field of Classification Search
CPC .... C01G 9/08; C04B 35/547; C04B 35/6455; C04B 2235/6565; C04B 2235/9653; C04B 2235/6567; C04B 2235/72; G02B 1/10; G02B 1/02; C23C 14/0629; C23C 14/357; C23C 16/306
See application file for complete search history.

(56) References Cited

U.S. PATENT DOCUMENTS

| | | | |
|---|---|---|---|
| 3,992,497 A * | 11/1976 | Terwilliger et al. ........... 264/654 |
| 4,414,115 A | 11/1983 | The |
| 4,939,043 A * | 7/1990 | Biricik et al. ................. 428/620 |
| 5,007,990 A | 4/1991 | Bladon |
| 5,062,930 A | 11/1991 | Dillon et al. |
| 5,173,443 A * | 12/1992 | Biricik et al. .................... 438/72 |
| 5,273,588 A * | 12/1993 | Foster et al. ............. 118/723 E |
| 5,280,156 A * | 1/1994 | Niori et al. ..................... 219/385 |
| 5,324,353 A | 6/1994 | Wahl et al. |
| 5,456,757 A * | 10/1995 | Aruga et al. ............. 118/723 E |
| 5,508,368 A | 4/1996 | Knapp et al. |
| 5,516,388 A * | 5/1996 | Moran et al. ................ 156/89.14 |
| 5,776,612 A | 7/1998 | Fisher |
| 5,800,879 A * | 9/1998 | Moran et al. .................. 427/577 |
| 5,837,322 A | 11/1998 | Moran et al. |
| 5,935,723 A | 8/1999 | Borden |
| 5,993,981 A * | 11/1999 | Askinazi et al. .............. 428/699 |
| 6,038,065 A | 3/2000 | Borden |
| 6,083,561 A | 7/2000 | Goela et al. |
| 6,221,482 B1 | 4/2001 | Goela |
| 6,410,172 B1 * | 6/2002 | Gilbert, Sr. ................... 428/698 |
| 6,472,057 B2 | 10/2002 | Goela |
| 6,653,212 B1 * | 11/2003 | Yamanaka et al. ............ 438/485 |
| 6,777,347 B1 * | 8/2004 | Ni et al. ......................... 438/771 |
| 6,860,802 B1 | 3/2005 | Vishwanathan et al. |
| 7,095,157 B2 | 8/2006 | Sung |
| 7,445,847 B2 | 11/2008 | Kulp |
| 7,517,588 B2 | 4/2009 | Frushour |
| 7,790,072 B2 | 9/2010 | Korenstein et al. |
| 2003/0209719 A1* | 11/2003 | Nakamura et al. .............. 257/89 |
| 2007/0062648 A1* | 3/2007 | Senbonmatsu et al. .. 156/345.51 |
| 2009/0000700 A1 | 1/2009 | Hogan et al. |
| 2009/0155162 A1 | 6/2009 | Korenstein et al. |
| 2010/0035036 A1 | 2/2010 | McCloy et al. |
| 2010/0063164 A1 | 3/2010 | Amirzadeh-Asl et al. |

FOREIGN PATENT DOCUMENTS

| | | |
|---|---|---|
| CN | 200710037164.1 | 10/2007 |
| CN | 200810159602.6 | 4/2009 |
| EP | 0 486 236 B1 | 8/1995 |
| EP | 0 917 658 B1 | 9/2005 |
| EP | 0 919 069 B1 | 11/2007 |
| GB | 1010082 | 1/1964 |
| WO | WO 97/13169 | 4/1997 |

* cited by examiner

Primary Examiner — Lee D Wilson
Assistant Examiner — Tyrone V Hall, Jr.
(74) Attorney, Agent, or Firm — John J. Piskorski

(57) ABSTRACT

Low scatter water clear zinc sulfide with reduced metal contamination is prepared by coating a chuck which holds zinc sulfide and machining the zinc sulfide with uncoated particles. An inert foil is cleaned with an acid cleaning method and also cleaning the zinc sulfide. The zinc sulfide is wrapped in the inert foil and then treated by a HIP process to provide a low scatter water-clear zinc sulfide. The low scatter water-clear zinc sulfide may be used in articles such as windows and domes.

9 Claims, No Drawings

QUALITY MULTI-SPECTRAL ZINC SULFIDE

This application claims the benefit of priority under 35 U.S.C. §119(e) to U.S. Provisional Application No. 61/489,380, filed May 24, 2012, the entire contents of which application are incorporated herein by reference.

The present invention is directed to improved quality multi-spectral water-clear zinc sulfide. More specifically, the present invention is directed to improved quality multi-spectral water-clear zinc sulfide which is substantially free of impurities that produce discoloration of the water-clear zinc sulfide and degrade its performance.

Zinc sulfide is a material which intrinsically is transparent from the visible to relatively long electromagnetic wavelengths in the infrared region. These properties contribute to its use in applications which require infrared transmission capability such as in infrared detectors and missile domes. Zinc sulfide articles are typically produced by chemical vapor deposition (CVD) or hot pressing of powder techniques. These techniques result in forms which are generally opaque and not functionally transparent in the visible or near-infrared regions of the electromagnetic spectrum. Hot isostatic pressing (HIP), a high pressure and high temperature treatment, has been found to sufficiently improve the transparency of zinc sulfide in the visible and near-ultraviolet regions such that the zinc sulfide can be used in applications requiring multi-spectral capability such as in armored vehicles and aircraft windows. In general this functionally transparent zinc sulfide is produced as follows: zinc sulfide is produced by a reaction of zinc vapor and hydrogen sulfide gas in a chemical vapor deposition chamber. This process produces relatively large sheets which are then sliced into smaller parts and machined to make the surfaces smooth. The zinc sulfide is then wrapped in metal foil and then subjected to the hot isostatic pressing or HIPping process which makes the material functionally transparent or water-clear. After the water-clear zinc sulfide is polished, it is inspected under fluorescent white light. Sometimes discolored material is observed. It is believed that the discoloration is caused by metallic contaminants. Accordingly, prior to HIPping the metal foil and zinc sulfide are desirably free of any metallic contaminants.

Conventional methods for cleaning zinc sulfide use organic cleaning agents which are based on alcohol, acetone and various surfactants. Such cleaners may remove organic contaminants but are inadequate to completely remove metallic contaminants which are strongly adhered to the surfaces or embedded in the zinc sulfide during machining and handling. Due to the relatively soft surface of zinc sulfide metallic machining marks are typically produced in the zinc sulfide. Such marks may go into the zinc sulfide. Such marks cannot be removed with conventional processes and can produce discoloration marks. One example is the circular marks produced by a Blanchard chuck. When zinc sulfide is mounted directly onto the Blanchard chuck and the zinc sulfide is machined, the pressure of the machining process can generate these marks. The intensity of these marks increases when the zinc sulfide is left on the chuck for extended periods of time and become dry. Grinding wheels used during the generating process may also introduce contaminants such as nickel and copper. Many grinding wheels use nickel and copper either in the composition of the wheel base or in the coating or binder for diamond or cubic boron nitride abrasive particles. During zinc sulfide generating the grinding wheels shed small particles that become lodged to rough machine surfaces on the edges or inside cracks that may be present in the zinc sulfide. These particles are difficult to clean due to their position in the low lying rough areas.

In addition foreign metals may also contaminate the metal foil during its production. Failure to remove such contaminants produces discolored zinc sulfide. For example, nickel and copper produces yellow material, chromium and cobalt produce green material and palladium produces reddish-brown material. In high concentration, metals, such as copper can produce very dark material, for example, if the copper concentration is greater than 100 ppm.

The discolored material has inferior performance and degrades the imaging quality of the water-clear zinc sulfide. The discolored material may increase optical absorption and degrade the transmission of the water-clear zinc sulfide in the ultra-violet (UV) to visible region. The discolored material may also increase the forward scatter and refractive index inhomogeneity which may affect the quality of the image through the water-clear zinc sulfide. The discolored material also has an inferior material appearance. Accordingly, there is a need for a water-clear zinc sulfide which is substantially free of metal contaminants and for a method of providing such water-clear zinc sulfide.

In one aspect a method includes coating, covering or combinations thereof a generating chuck; placing a zinc sulfide in the coated, covered or combinations thereof generating chuck; and generating the zinc sulfide substrate.

In another aspect a method includes coating, covering or combinations thereof a generating chuck; placing a zinc sulfide substrate in the coated, covered or combinations thereof generating chuck; generating the zinc sulfide substrate with uncoated abrasive particles; cleaning metallic contaminants from the zinc sulfide substrate; cleaning metallic contaminants from a platinum foil by microetching and cleaning with sulfuric acid, nitric acid or combinations thereof; wrapping the cleaned zinc sulfide substrate in the cleaned platinum foil; and treating the cleaned zinc sulfide substrate wrapped in the cleaned platinum foil by a HIP process.

The methods provide for a generating chuck which prevents the formation of machining marks on zinc sulfide substrates. In addition, the methods provide for functionally transparent or water-clear zinc sulfide substantially free of metal contaminants such that there is no observable discolored material, or such that the discoloration is reduced to levels such that it does not significantly compromise the performance of the water-clear zinc sulfide for its intended use. The water-clear zinc sulfide has high transmission in the visible region, low forward scatter which leads to a better image quality, less edge blurriness, and a higher refractive index homogeneity leading to improved image quality than many conventional water-clear zinc sulfide materials. The water-clear zinc sulfide may be used to produce a variety of optical articles such as windows, domes, lenses and beam splitters. Such articles may be used in aircraft, armored vehicles, infrared (IR) cameras and scientific instruments such as spectrophotometers. One common application of the water-clear zinc sulfide is for multi-spectral applications that require a single aperture or beam path for several wavebands in the visible light and IR regions.

As used throughout this specification, the following abbreviations shall have the following meanings, unless the context indicates otherwise: ° C.=degrees Centigrade; μm=microns=micrometers; m=meters; cm=centimeter; nm=nanometers; mM=millimolar; mN=milliNewton; CVD=chemical vapor deposition; PVD=physical vapor deposition; MOCVD=metalorganic chemical vapor deposition; sccm=standard cubic centimeters per minute; L=liters; Hz=hertz; kHz=kilohertz; GHz=gigahertz; 1 atmosphere=760 torr; 1 atmosphere=$1.01325 \times 10^6$ dynes/cm$^2$; psi=pounds per square inch; 1 atmosphere=14.7 psi;

Ksi=kilo-pounds per square inch; A=amperes; mA=milliamperes; W=Watt; kW=kilowatt; eV=electron volt; AC=alternating current; DC=direct current; psi=pounds per square inch; slpm=standard liters per minute; Å=angstrom; IR=infrared; and UV=ultra-violet. The term "chuck" means a device for holding a workpiece. The terms "generating" and "machining" are used interchangeably throughout the specification. The term "non-reactive metals" means metals which do not react with zinc sulfide or diffuse in it to create discoloration.

All percentages are by weight unless otherwise noted. All numerical ranges are inclusive and combinable in any order, except where it is logical that such numerical ranges are constrained to add up to 100%.

Deposits of zinc sulfide may be produced in conventional CVD or PVD furnaces. Such furnaces typically are enclosed in vertically-oriented water-cooled stainless steel vacuum chamber housings. A graphite retort contains molten zinc and provides a heating means, such as resistance or radiant heating elements, at the bottom of the deposition chamber. A hollow mandrel, typically made of graphite, is vertically arranged above the zinc retort with its interior in flow communication with the retort. Typically the mandrel is rectangular in shape or it may be in the form of a tube. A second heating element, such as resistance heaters, capable of heating the mandrel are provided around the mandrel's exterior. Gas injectors provide hydrogen sulfide and inert gas, such as argon or nitrogen, to lower portions of the mandrel's interior. Gas exhaust at the top of the furnace's housing is operatively connected to a filtration system to remove particulates, then to a vacuum source, such as a vacuum pump and finally to a scrubber to remove unreacted hydrogen sulfide and any other toxic products. Mandrel temperature is measured by a thermocouple touching the mandrel at its external surface. Zinc temperature in the retort is measured by averaging the temperature measurements of two thermocouples, one touching the upper portion of the retort's wall, above and near the level of molten zinc, and another extending to the lower portion of the retort's wall below the level of molten zinc. Such furnaces are disclosed in U.S. Pat. Nos. 6,221,482 and 6,083,561.

In operation, elemental zinc is vaporized in the zinc retort at temperatures greater than 575° C. The vaporized zinc is mixed with hydrogen sulfide and a carrier gas as they enter the mandrel from the injector. The mixed gases are caused to flow through the interior of the mandrel wherein they contact the heated interior surface of the mandrel causing zinc and hydrogen sulfide to react to form zinc sulfide on the interior surfaces of the mandrel. The carrier gas and any gaseous or entrained reaction products are removed from the chamber through the gas exhaust and are then processed through the filtration and scrubbing systems. Once started the process is continued until the desired thickness of the zinc sulfide is deposited on the mandrel. Typically deposition is greater than 15 hours and may take up to 1100 hours. More typically deposition is from 100 hours to 600 hours. Typically the initial mandrel temperature is 690° C. or higher and is gradually decreased or ramped down by at least 10° C. to target the mandrel temperature of less than 680° C., typically within a range of 660° C. to 680° C. over the course of 5 to 20 hours of the run, more typically during the first 8 to 15 hours and then maintaining the target mandrel temperature for the remainder of the run.

A stoichiometric excess of zinc is maintained in the deposition zone after an initial ramping up of the zinc vapor concentration in the gas mixture supplied to the deposition zone. A hydrogen sulfide to zinc molar ratio of less than 0.8, typically of 0.6 to 0.8 is provided after initial ramping of the zinc vapor concentration. During the initial ramping up, the flow of zinc vapor is initiated at a minimal value at the beginning of each run and is slowly increased, or ramped up, to the target, or sustained, flow rate over the initial 10 to 90 hours and, typically, over the initial 30 to 60 hours, of the run. In general such is accomplished by initially setting and then maintaining the hydrogen sulfide and a carrier gas flow rates while slowly ramping up the zinc retort temperature. The zinc retort temperature is typically maintained at least 10° C. lower, more typically 15° C. lower, and most typically 20° C. lower than the mandrel temperature. In general furnace pressures are at furnace absolute pressures of less than 60 torr, typically 30 to 40 torr. When a desired thickness is achieved, the gas flow through the gas injector is discontinued, the first heating element is turned down, the second heating element is turned off, the chamber housing is opened and the mandrel is removed. The zinc sulfide deposited on the interior walls of the mandrel is then removed therefrom and cut into sheets of desired size. Conventional cutting tools, such as mechanical cutting tools or water jet cutting tools may be used.

The zinc sulfide sheets are machined to remove any contaminants such as graphite from the mandrel side and are generated or machined to smooth the deposition side. Machining may be done using various conventional apparatus. Such processes include, but are not limited to, grinding, lapping and honing. Such apparatus typically include a chuck for holding the workpiece. One or more coatings are placed in the chuck to protect the zinc sulfide from machining marks caused by the tension to secure the zinc sulfide in the chuck and during the vigorous activity during generating. Any play between the zinc sulfide and the chuck during generating can cause machining marks in the zinc sulfide. Such marks may penetrate the relatively soft surface of the zinc sulfide substrates creating havens for metal contaminants. One or more coatings may be applied to the chuck or in the alternative the chuck may be covered with a material which does not contaminate the zinc sulfide and at the same time protects it from contamination. Combinations of coatings and coverings also may be used to protect the zinc sulfide from contamination. Such coatings include, but are not limited to, ceramic materials and non-reactive metals. Cover materials include, but are not limited to, polyurethane impregnated polyester pads.

The polyurethane impregnated polyester pads are sufficiently hydrophilic to provide surface tensions greater than or equal to 34 mN/m or such as from greater than or equal to 37 mN/m or such as from greater than or equal to 40 mN/m. Typically such pads have a surface tension of 34 mN/m to 40 mN/m. The pads may range in thickness from 0.2 cm to 3 cm. Such polyurethanes and polyesters have a modulus of 1 to 200 MegaPascals and an elongation to break in the range of 25% to 1000%, typically 50% to 500%, more typically 100% to 350%. Such pads have porosities of 10% to 50% or such as from 10% to 40% or such as from 20% to 30%. Typically such pads have an open pore structure. An open pore structure contains pores that are connected to each other and form an interconnected network. In addition, such pads have densities from 0.3 g/cm$^3$ to 1.5 g/cm$^3$ or such as from 0.5 g/cm$^3$ to 1.4 g/cm$^3$ or such as from 0.8 g/cm$^3$ to 1.2 g/cm$^3$. Such pads are well known in the art and one method of making such pads is disclosed in U.S. Pat. No. 7,517,488. An example of a commercially available pad is SUBA™ IV Polishing Pad available from Rohm and Haas Electronic Materials, LLC.

Ceramics include, but are not limited to, nitrides and oxides. Examples of suitable nitrides are aluminum nitride, boron nitride and titanium nitride. Examples of suitable oxides include, but are not limited to aluminum oxide, silicon dioxide, magnesium oxide and magnesium aluminum oxide (spinel). Coating thickness for ceramic materials may range from 0.1 µm to 10 mm or such as from 5 µm to 5 mm or such as from 10 µm to 3 mm Such ceramics may be applied to coat a chuck using one or more methods including, but not limited to, thermal spray, CVD, MOCVD and PVD such as, but not limited to, sputtering, electron beam evaporation, ion assisted deposition and microwave-assisted magnetron sputtering. Such processes are well known in the art for coating substrates with ceramic materials.

Nonreactive metals include, but are not limited to, gold, platinum, tantalum, tungsten, rhodium and molybdenum. Coating thickness for nonreactive metals is from 10 nm to 1 mm or such as from 100 nm to 500 µm. Such nonreactive metals may be applied to coat a chuck using one or more of the methods used to deposit ceramics mentioned above.

In general, conventional reactants may be used to deposit the CVD coatings. Deposition temperatures and pressures may vary depending on the type of coating. Conventional deposition chambers may be used. CVD is performed in inert atmospheres such as argon, helium, neon, krypton, xenon, nitrogen and mixtures thereof. Flow rates for such inert gases during deposition are conventional. Conventional reactant flow rates may be used and varied during deposition to obtain the desired deposition rates. Minor experimentation may be required. Typically, furnace temperatures may range from 100° C. to 1500° C. Furnace pressures may range from 20 torr to 760 torr. Coating deposition rates may range from 0.01 µm/minute to 5 µm/minute.

There are a number of different PVD techniques which are distinguished by the manner in which the source material is vaporized. Such methods are well known in the art. Typically used physical vapor deposition techniques for converting solid material into gaseous plasma are: (a) resistance or induction heating; (b) electron beam or ion bombardment; and (c) electric arc or cathodic arc vapor deposition.

In resistance and induction heating techniques, the solid material is brought to its melting point by an external heat source or by passing high electric current levels through the solid material. The solid material or a portion thereof, first melts to a molten liquid state, and then vaporizes to a gaseous state to form the plasma.

In electron beam and ion bombardment techniques, a molten pool of material is created by bombarding the solid material with a high-energy beam of electrons or ions. The solid material is referred to as a "target" toward which the electrons or ions impart sufficient kinetic energy to the target material causing atoms, ions, molecules, ionized molecules and agglomerates of molecules to leave the target source material in the core of plasma. In general, where an electromagnetic beam is generated by an electron beam, ion beam or electrical arc an electrical current flows to the material to be deposited. The current may range from 5 mA to 100 mA. The energy delivered by the electromagnetic beam may be defined in terms of a power density, which is the average power surface of the ceramic or metal. Average power densities may range from 1000 W/cm$^2$ to 5000 W/cm$^2$ at a point on the surface upon which the beam is directed. The peak power density of the electromagnetic beam may be from 5000 W/cm$^2$ to 10,000 W/cm$^2$. The peak power density may be defined as a process setting where the beam is at its maximum focus (i.e. smallest spot size) at a given power setting. Dwell times for the electromagnetic beam may range from 0.1 milliseconds to 5 milliseconds.

In electric arc physical vapor deposition an electric arc is struck and maintained between the solid material, which is electrically biased to serve as a cathode, and an anode that is spaced apart from the cathode. An arc-initiating trigger element is positioned proximate to the cathode and is positively biased with respect to the cathode. The trigger element is momentarily allowed to engage the surface of the cathode material, establishing a current flow path through the trigger and cathode. As the trigger element is removed from engagement with the cathode, an electrical arc is struck, which arc is thereafter maintained between the cathode and the anode of the chamber. The electric arc carries high electric current levels ranging from 30 to several hundred amperes and provides energy for vaporizing the solid material. The arc terminus is visible on the surface of the cathode where the arc touches the cathode and is referred to as the cathode spot. One or more of such cathode spots may exist on the cathode surface at one time depending upon the current present in the arc. The cathode spot randomly moves across the surface of the solid material, instantaneously vaporizing the solid material into plasma. The plasma contains atoms, molecules, ions, and agglomerates of molecules, and both ion charged and neutral particles.

In sputtering methods the substrate is mounted in a reactive sputtering drum coater with the surface to be coated facing into the interior of the sputtering drum coater or coating chamber. An example of one type of sputtering drum coater is a MicroDyn™ reactive sputtering drum coater (available from Deposition Sciences Inc., Santa Rosa, Calif.). The chamber may be in the shape of an octagon. Each face of the octagon supports a process zone. The process zone is equipped with one of the following: DC magnetron, AC magnetron pair, microwave plasma applicator or heater. Mid-frequency pulsed DC power supplies power to the DC magnetrons. Mid-frequency AC power supplies power to the AC magnetrons. The AC magnetrons may minimize loss at the anode which is caused by migration of material from anode to cathode and typically provides a higher quality coating.

In microwave-assisted magnetron sputtering two or more sputtering sources and two or more microwave plasma sources may be used simultaneously to increase coating material deposition rate. Typically two sputtering sources and two microwave plasma sources are used simultaneously. In the magnetron sputtering a metal electrode, such as aluminum or titanium is used as the target. The electrode provides the source of the metal for the coating and typically is 99% to 99.99% pure. The target distance from the chuck substrate may range from 8 cm to 20 cm. This method permits wide deposition areas of 130,000 cm$^2$ and greater. Microwave driven plasmas dissociate diatomic molecules of oxygen or nitrogen. The coating chamber may be pumped down to a pressure of $10^{-5}$ Torr to $10^{-6}$ Torr prior to deposition. Diatomic oxygen or nitrogen and an inert gas, such as argon, neon or krypton, are introduced into the coating chamber. Flow rates of diatomic oxygen and nitrogen may range from 20 sccm to 80 sccm. The flow rate of the inert gas may be from 30 sccm to 150 sccm. Total pressure in the chamber may range from $2\times10^{-3}$ Torr to $7\times10^{-3}$ Torr. Diatomic oxygen or nitrogen partial pressure may range from $1\times10^{-4}$ Torr to $20\times10^{-4}$ Torr. The microwave source ionizes the mixture of the inert gas and diatomic oxygen or nitrogen to create plasma near the microwave source. The microwave power may range from 1 kW to 5 kW. Frequencies may range from 1 GHz to 5 GHz. Dissociation energies range from 1 eV to 20 eV and support bond formation between the metal and the oxygen or nitrogen. Energy imparted to monoatomic species created by the dissociation is transferred to the growing thin film on the substrate. The drum upon which the substrate is mounted is rotated at the rate of 0.75 to 3 revolutions/second depending upon the coating deposition rate. Minor experimentation may be required to determine the appropriate rotation rate with the corresponding deposition rate. The method is such that these two steps are performed substantially simultaneously to provide stoichiometric metal oxide or metal nitride coatings. The DC or AC pulsed power ranges from 3 kW to 9 kW. Frequencies may range from 20 kHz to 50 kHz. During deposition the microwave plasma is kept on to stabilize the target plasma and to increase coating oxygen or nitrogen consumption. The chuck substrate is maintained at temperatures of 40° C. to 200° C. Deposition times range from 20 hours to 90 hours.

Typically, the surfaces are generated with resin bonded wheels that use uncoated abrasive particles. Such resins include, but are not limited to, epoxy, acrylic and phenolic resins. Such resins are well known in the art. Uncoated abrasive particles include, but are not limited to, diamond silicon carbide, titanium carbide, silicon nitride, tungsten carbide and boron carbide. Such uncoated abrasive particles have a Mohs hardness of 9 and higher. Combinations of such materials also may be used. The abrasive may be in particle form or particles bonded to the resin of the grinding wheel. The surface speed of the wheel is at least 1000 m/minute or such as from 2000 m/minute to 10,000 m/minute. Pressures may be applied to the chuck substrate from 10 psi to 100 psi or such as from 20 psi to 80 psi.

Coating the chuck and generating the zinc sulfide using uncoated abrasive particles reduce the number of contaminants on the zinc sulfide; however, the zinc sulfide sheet may still have metallic particles, such as nickel, copper, chromium, cobalt and palladium, on its surface. The metal particles typically reside on rough spots and may enter inside cracks or other defects in the zinc sulfide. The contamination is observable as discolored material. The zinc sulfide is cleaned to reduce or substantially remove all of the metallic contaminants. Cleaning is done with methods which provide a final functionally transparent or low scatter water clear zinc sulfide which includes no observable degradation in transmission at a wavelength of 0.3 µm to 1 µm or such as from 0.4 µm to 0.8 µm, less than or equal to 3%/cm forward scatter as measured in a half cone angle of 3 degrees from the direction of incident beam @ 0.6328 µm wavelength using a helium/neon laser, and a refractive index homogeneity of less than or equal to 15 ppm, or such as less than or equal to 10 ppm. Preferably the refractive index homogeneity is less than or equal to 5 ppm, most preferably less than or equal to 1 ppm. The refractive index homogeneity is the change of refractive index per refractive index as is well understood in the art. The methods include, but are not limited to, ultrasonic alkaline clean, inorganic acid clean, organic acid clean, cyanide clean, sulfur containing compounds clean and amine clean. The methods may be used individually or combined to clean zinc sulfide of at least metallic contaminants.

Alkaline compounds which may be used in the ultrasonic alkaline clean include, but are not limited to, alkali metal bases such as potassium hydroxide, sodium hydroxide, ammonium hydroxide, caustic or mixtures thereof. An aqueous solution is prepared which includes the alkaline compounds in sufficient amounts to provide a pH range from greater than 7 to 14 or such as from 8 to 13 or such as from 9 to 12. Typically the pH ranges from 7.5 to 11 or such as from 8 to 10. The alkaline solution is contained in an ultrasonic cleaner and the zinc sulfide is then immersed in the alkaline solution. Conventional ultrasonic cleaners may be used and are commercially available. Examples of ultrasonic cleaners include the various ultrasound apparatus available from Crest Corporation and also SONICOR™ SC ultrasonic cleaner available from Sonicor, Inc., Wallingford, Conn. Prior to immersing the zinc sulfide in the alkaline solution the zinc sulfide may optionally be rinsed with water or wiped with a sanitary wipe such as SURE WIPES™, available from BIOTEK Corporation, Broadview, Ill., to remove any sludge remaining on the zinc sulfide after machining. Cleaning is done at 10 kHZ to 100 kHz, or such as from 20 kHZ to 50 kHZ. Cleaning time may range from 1 minute to 20 minutes, or such as from 5 minutes to 15 minutes. After cleaning the zinc sulfide is rinsed with water and wiped clean with a sanitary wipe or air dried. Commercially available alkaline cleaners which may be used include, but are not limited to, SONICOR™ 205 solution (carbon and rust remover with heavy duty caustic), SONICOR™ 202 (buffering compound with non-caustic alkaline) and SONICOR™ 106 (optical cleaner, mildly alkaline), SONICOR™ 106 (jewelry cleaner, ammoniated special purpose cleaner) and SONICOR™ 116 (SONIC STRIP™ heavy duty alkaline). The commercially available products may be used as is or they may be diluted with water to provide the desired pH. Typical dilutions are with water and may range from 1 part by volume of commercial cleaner to 10 parts by volume water or such as 1 part by volume of cleaner to 3 parts by volume water. Minor experimentation may be done to determine a particular dilution with a commercial cleaner to achieve the desired pH and cleaning performance.

The zinc sulfide may be cleaned with inorganic acids which include, but are not limited to, hydrochloric acid, sulfuric acid, nitric acid, phosphoric acid, hydrofluoric acid and mixtures thereof. Typically the acid is hydrochloric acid, sulfuric acid, nitric acid and mixtures thereof. More typically the acid is sulfuric acid, nitric acid and mixtures thereof. When two or more acids are mixed, they are mixed in amounts to enable the removal of substantially all of the metal contaminants. Minor experimentation may be done to achieve the optimum cleaning performance of the inorganic acid mixtures. An aqueous solution of one or more of the inorganic acids is made having a concentration of 1 mM to 50 mM, or such as 5 mM to 10 mM inorganic acid. In general the pH of the inorganic acid solutions are from 1 to 4, or such as from 3 to 4. The inorganic acid aqueous solution is applied to the surface of the zinc sulfide or the zinc sulfide is immersed in the aqueous acid solution for 1 minute to 30 minutes or such as from 5 minutes to 20 minutes. Typically the zinc sulfide is treated with the aqueous acid solution for 5 minutes to 15 minutes. Temperatures may range from room temperature to 50° C. or such as from 25° C. to 35° C. The inorganic acid treated zinc sulfide is then dried and then rinsed with high purity acetone, such as 90% and greater, at room temperature. Rinsing may be done for 1 minute to 2 minutes.

Zinc sulfide may be cleaned with organic acids which include, but are not limited to, carboxylic acids and salts thereof. Carboxylic acids include monocarboxylic acids and polycarboxylic acids. Mixtures of such carboxylic acids and their salts also may be used. Monocarboxylic acids include, but are not limited to, acetic acid, lactic acid and gluconic acid and salts thereof. Polycarboxylic acids include, but are not limited to, oxalic acid, malonic acid, maleic acid, tartaric acid, succinic acid, citric acid and glutamic acid and salts thereof. One or more acid anhydrides also may be included. Typically the organic acid is acetic acid, oxalic acid, citric acid, salts thereof and mixtures thereof. More typically the acid is acetic acid, oxalic acid, salts thereof and mixtures thereof. Most typically the acid is acetic acid and oxalic acid and mixtures thereof. When two or more organic acids or their salts or anhydrides are mixed, they are mixed in amounts to enable the removal of substantially all of the metal contaminants. Minor experimentation may be done to achieve the optimum cleaning performance of the organic acid mixtures. An aqueous solution of one or more of the organic acids, salts thereof and anhydrides is made having a concentration of 1% to 50%, or such as 5% to 30% or such as from 10% to 20% organic acid, salts thereof or anhydrides. In general the organic acid solutions have a pH of less than 7 or such as from 1 to 6 or such as from 2 to 4.

The organic acid aqueous solution is applied to the surface of the zinc sulfide or the zinc sulfide is immersed in the aqueous acid solution for 1 minute to 60 minutes or such as from 5 minutes to 30 minutes. Typically the zinc sulfide is treated with the aqueous acid solution for 10 minutes to 20 minutes. Temperatures may range from room temperature to 50° C. or such as from 25° C. to 35° C. The organic acid treated zinc sulfide is then rinsed with water, dried and then rinsed with high purity acetone at room temperature; alternatively, it may be first rinsed with alcohol such as methyl alcohol or isopropyl alcohol followed with rinsing in acetone. Rinse time is the same as described above when cleaning with inorganic acids.

Zinc sulfide may be cleaned with cyanide, cyanate or mixtures thereof. An aqueous alkaline solution is prepared from alkali metal salts, such as sodium cyanide, potassium cyanide, sodium cyanate, potassium cyanate, sodium thiocyanate, potassium thiocyanate or mixtures thereof. The concentrations of the cyanides and cyanates may range from 5% to 20% or such as 10% to 15%. The pH of the solution may range from 8 and greater or such as from 9 to 14 or such as from 10 to 12. The pH of the solution may be maintained by the addition of sufficient amounts of base. Such bases include, but are not limited to, alkali metal hydroxides, alkali metal bicarbonates, alkali metal carbonates or mixtures thereof. The aqueous alkaline solution is applied to the zinc sulfide or the zinc sulfide is immersed in the solution. The zinc sulfide is treated with the aqueous alkaline solution for 5 minutes to 25 minutes or such as from 10 minutes to 20 minutes. Temperatures of the solution may range from room temperature to 50° C. or such as from 25° C. to 40° C. The cyanide or cyanate treated zinc sulfide is then rinsed with water, dried and then rinsed with high purity acetone at room temperature; alternatively, it may be rinsed first with alcohol such as methyl alcohol or isopropyl alcohol followed with rinsing with acetone.

Zinc sulfide may be cleaned of metallic contaminants using sulfur or thiocompounds in an aqueous alkaline solution. Such sulfur or thiocompounds include, but are not limited to, sulfates, mercapto compounds, thiourea and its derivatives. Mixtures of such compounds also may be used. Sulfates include, but are not limited to, ammonium sulfate, ammonium persulfate, ammonium thiosulfate, sodium sulfate, sodium persulfate, sodium thiosulfate, potassium sulfate, potassium persulfate and potassium thiosulfate. Mercapto compounds include, but are not limited to, 2-mercaptobenzoic acid, mercaptolactic acid, mercaptoacetic acid, mercaptosuccinic acid, mercaptophenol and 2-mercaptobenzoxazole. Thiourea derivatives include but are not limited to, dimethylthiourea, diethylthiourea, N,N'-diisopropylthiourea, acetylthiourea, allylthiourea, ethylenethiourea, 1,3-diphenylthiourea and thiourea dioxide. The concentrations of the one or more thiocompounds in the alkaline aqueous solution may range from 5% to 20% or such as 10% to 15%. The pH of the solution may range from 8 and greater or such as from 9 to 14 or such as from 10 to 12. The pH of the solution may be maintained by the addition of sufficient amounts of base. Such bases include, but are not limited to, alkali metal hydroxides, alkali metal bicarbonates, alkali metal carbonates or mixtures thereof. The aqueous alkaline thiocompound solution is applied to the zinc sulfide or the zinc sulfide is immersed in the solution. The zinc sulfide is treated with the aqueous alkaline solution for 5 minutes to 25 minutes or such as from 10 minutes to 20 minutes. Temperatures of the solution may range from room temperature to 50° C. or such as from 25° C. to 40° C. The cleaned zinc sulfide is then rinsed with water, dried and then rinsed with high purity acetone at room temperature; alternatively, it may be rinsed first with alcohol such as methyl alcohol or isopropyl alcohol followed with rinsing in acetone.

Zinc sulfide may be cleaned of its metal contaminants with a basic aqueous amine solution. Amines which may be used include, but are not limited to, primary amines, secondary amines, tertiary amines, organic amines and quaternary ammonium compounds. Primary amines include, but are not limited to, ammonia, butylamine, monoethanolamine and octylamine. Secondary amines include, but are not limited to, ethylenediamine, dibutylamine, methylbutylamine and diethanolamine. Tertiary amines include, but are not limited to, triethnolamine Amines also include ethylenediamine tetraacetic acid (EDTA) and diethylenetriamine pentacetic acid. The concentrations of the one or more amines in the aqueous solution may range from 1% to 20% or such as 5% to 10%. The zinc sulfide is treated with the aqueous amine solution for 5 minutes to 25 minutes or such as from 10 minutes to 20 minutes. Temperatures of the solution may range from room temperature to 50° C. or such as from 25° C. to 40° C. The cleaned zinc sulfide is then rinsed with water, dried and then rinsed with high purity acetone at room temperature; alternatively, it may be rinsed first with alcohol such as methyl alcohol or isopropyl alcohol followed with rinsing in acetone.

After the zinc sulfide is generated and cleaned to remove at least the metallic contaminants, it is wrapped in pre-cleaned foil, such as a platinum foil. Platinum foil is produced by first purifying platinum melt to required purity levels of 99% and greater, solidifying the melt in small and thick ingots and then rolling the ingots into thin platinum foils in a multi-step process. Such processes are well known in the art. During the foil drawing and cutting processes metallic contaminants may become incorporated on the platinum surface and along the edges of the foil. To remove substantially all of the metallic contaminants from the platinum foil, the platinum foil may be cleaned with an acid clean.

The platinum foil may be etched and cleaned with a solution of sulfuric acid or nitric acid. First the foil is cleaned with an aqueous solution including one or more surfactants. Surfactants include nonionic, cationic, anionic and amphoteric surfactants. Conventional surfactants well known in the art may be used. Typically the surfactants are nonionic such as alkylphenoxy polyethoxyethanols and water soluble organic compounds containing multiple oxyethylene groups such as polyoxyethylene polymers having from 20 to 150 repeating units. Also included are block copolymers of polyoxyethylene and polyoxypropylene. Typically the surfactant formulations are low foaming. An example of a commercially available acidic low foaming surfactant formulation is RONACLEAN™ PC 590 available from Rohm and Haas Electronic Materials, LLC, Marlborough, Mass. Surfactants are included in aqueous solutions in amounts of 5% to 40% or such as from 10% to 30% or such as from 15% to 25%. The platinum foil is rinsed with the surfactant solution or it is immersed in the solution for 1 minute to 15 minutes or such as from 5 minutes to 10 minutes. Surfactant cleaning is done at temperatures of from room temperature to 50° C. or such as from 25° C. to 45° C. The surfactant cleaner removes oxides as well as organic contaminants from the foil. The platinum foil is then rinsed with water to remove any residues left from the surfactant solution. Rinsing is typically done for 60 seconds to 2 minutes at room temperature.

The foil is then treated with an etching solution which includes sulfuric acid as well as one or more oxidizing agents. Sulfuric acid is included in the etching solution in amounts of 0.5% to 20% or such as from 5% to 15% of the solution. Oxidizing agents include, but are not limited to, sodium or potassium permanganate and hydrogen peroxide. They are included in the etching solution in amounts of 0.5% to 10% or such as from 5% to 10% of the solution. A commercially available etch bath is PREPOSIT™ ETCH 748 solution available from Rohm and Haas Electronic Materials, LLC. Sulfuric acid is mixed with the PREPOSIT™ ETCH 748 solution in amounts to provide sulfuric acid in desired concentration ranges. Etching is done for 1 to 10 minutes or such as from 2 to 5 minutes. Etching temperatures may range from room temperature to 30° C. The Etched foil is then rinsed with water at room temperature. Rinsing may typically be from 1 minute to 3 minutes. The foil is then dried such as with compressed air.

The platinum foil may be etched and cleaned with an aqueous solution of nitric acid. While not being bound by theory, it is believed that the nitric acid may react with the metallic contaminants to form nitrates which are water soluble and may be removed with a water rinse. The nitric acid is at a concentration of 5% to 50% or such as from 10% to 40% or such as from 15% to 30%. The platinum foil is treated with the nitric acid solution by applying the solution to the foil or by immersing the foil in the nitric acid solution. The foil is treated with the nitric acid solution for 1 to 15 minutes or such as from 5 to 10 minutes. The foil is then rinsed with water for a sufficient time to remove the water soluble nitrates. Rinsing may be from 1 minute to 4 minutes or such as from 2 to 3 minutes.

The platinum foil may be cleaned using a combination of etching and nitric acid cleaning. Minor experimentation may be done to modify the parameters of the etching and nitric acid clean when both methods are used to treat the inert platinum foils.

The cleaned zinc sulfide wrapped in the cleaned platinum foil is then treated by a HIP process. The HIP process involves positioning the wrapped zinc sulfide in a graphite crucible in a conventional HIP furnace. The furnace is first evacuated and then pressurized with an inert gas, such as argon. Heating is begun and the temperature is allowed to rise to its set point where the temperature and pressure stabilize and are maintained for the desired extended treatment time. The wrapped zinc sulfide is typically subjected to temperatures greater than 700° C., typically 900° C. to 1000° C., and isostatic pressures from 5,000 psi to 30,000 psi, typically from 15,000 psi to 30,000 psi, for an extended time of up to 150 hours, typically 70 to 100 hours. Upon completion of the desired treatment time, the heating is discontinued and the wrapped zinc sulfide is allowed to cool. Cooling is done by controlling the rate of cooling to less than 50° C. per hour, typically less than 31° C. per hour. The pressure is released in the HIP furnace after the temperature falls below 500° C. The final product is functionally transparent or low scatter water clear zinc sulfide which is substantially free of at least metallic contaminants. Substantially free of metallic contaminants typically means that there is less than 100 ppm, or such as less than 10 ppm or such as less than 1 ppm of detectable metal contaminants. The low scatter water clear zinc sulfide is capable of final shaping, lapping and polishing to precisely shaped optical components.

Lapping and polishing may be done using conventional apparatus and methods, such as with various lapping apparatus, and polishing pads. When lapping plates are used, the plates turn at surface speeds of 300 m/minute to 3000 m/minute or such as from 600 m/minute to 2500 m/minute. Lapping and polishing are done at pressures of 1 psi to 15 psi, and from 1 hr to 10 hrs.

Lapping and polishing may be done with slurries, pastes and dry particles provided that the components do not include materials which would contaminate the cleaned low scatter water clear zinc sulfide. Various types of uncoated particles may be used as well as sizes. Uncoated particles include, but are not limited to, diamond, aluminum oxide, silicon carbide, silicon nitride, boron carbide, boron nitride, carbon nitride and mixtures thereof. Particle sizes may range from 0.005 μm to 30 μm. When diamond paste is used the uncoated diamond particles sizes may range from 2 μm or less, typically 1 μm or less. Such abrasive particles may compose 1 wt % to 30 wt % of slurries. Conventional additives such as chelating agents, buffers and surfactants may be included in the slurries in conventional amounts. Lapping and polishing may be done in multiple steps of varying particle sizes to achieve the desired surface smoothness. Typically the low stress water clear zinc sulfide is lapped and polished to a scratch/dig ratio of 120/80 to 10/5, more typically 80/50 to 60/40.

The functionally transparent or low scatter water-clear zinc sulfide is substantially free of metal contaminants such that there is no observable discolored material, or such that the discoloration is reduced to levels that it does not significantly compromise the performance of the zinc sulfide for its intended use. The low scatter water-clear zinc sulfide has high transmission in the visible region, low forward scatter of less than 3%/cm or such as from 1%/cm to 3%/cm @ 632.8 nm which leads to a better image quality, less edge blurriness, and a higher refractive index homogeneity of 15 ppm or less or such as from 0.5 ppm to 15 ppm leading to improved image quality than conventional water-clear zinc sulfide. The low scatter water-clear zinc sulfide may be used as a multispectral material to transmit in the wavelength range of 0.35 μm to 12 μm range. The low scatter water-clear zinc sulfide may be used to produce a variety of optical articles such as windows, domes, lenses and beam splitters. Such articles may be used in aircraft, armored vehicles, IR cameras and scientific instruments such as spectrophotometers. The low scatter water-clear zinc sulfide also may be used for multi-spectral applications that require a single aperture or beam path for several wavebands in the visible light and IR regions.

The following examples are included to illustrate the invention, but are not intended to limit the scope of the invention.

EXAMPLE 1

Five plates of chemical vapor deposited zinc sulfide having dimensions 25 cm×25 cm×1 cm are prepared by generating (machining) the zinc sulfide plates in a Blanchard grinder having resin bonded wheels with an average uncoated diamond grit size of 240 and concentration 100 (72 carat/in$^3$) and uncoated diamond depth of 0.16 cm from national Diamond Laboratory, Los Angeles, Calif. Polishing pads are placed between the zinc sulfide plates and the chuck of the Blanchard grinder. The polishing pads are polyurethane impregnated polyester pads with a porosity of 20% to 30% and a density of 1.2 g/cm$^3$. Machining is done at a rate of 20 kHZ for 5 minutes. The zinc sulfide plates are then cleaned in a SONICOR™ SC ultrasonic cleaner using SONICOR™ 205 heavy duty caustic solution diluted 15 to 1 by volume with water. The cleaning solution is maintained at room temperature. The zinc sulfide plates are removed from the ultrasonic cleaner and wiped dry with SURE WIPES™.

Ten platinum foil sheets of 99.99% purity with the dimensions 36 cm×30 cm×0.002 cm are cleaned by immersing the sheets in a 20% RONACLEAN™ PC 590 low foaming surfactant solution for 5 minutes. The solution temperature is set at 42° C. The surfactant solution removes oxides as well as organic contaminants from the platinum foil. Each platinum foil sheet is then removed from the cleaning solution and rinsed with deionized water for 1 minute. Each platinum foil is then immersed in an aqueous etch solution of PREPOSIT™ ETCH 748 solution with 6 g/L of sulfuric acid at 25° C. The foils are left in the solution for 8 minutes. After etching is complete the foils are removed from the etch solution and rinsed with deionized water for 2 minutes at room temperature. The foils are dried with compressed air.

The five zinc sulfide plates are wrapped in the ten cleaned platinum sheets (two platinum sheets for each zinc sulfide plate). The wrapped zinc sulfide plates are placed in a graphite crucible. The crucible containing the wrapped zinc sulfide is HIPped in a conventional HIP furnace at a temperature of 1000° C. and at a pressure of 15 Ksi for 90 hours in an argon environment to provide low scatter water clear zinc sulfide. After HIPping the crucible is cooled slowly at a rate of 30° C./hour to 60° C./hour. When the wrapped low scatter water clear zinc sulfide plates cool to room temperature, they are removed from the furnace and the plates are unwrapped. They are then generated, lapped and polished to evaluation polish of scratch/dig=120/80. A Blanchard grinder with diamond abrasive having a Mohs hardness of at least 9 is used. The zinc sulfide plates are placed on the polishing pads in the chuck of the Blanchard grinder. The surface speed of the wheel is 1000 m/minute. The uncoated diamond abrasive is applied at pressures of 20 psi to 30 psi. The plates are then lapped using a Pellon Pad™ lapping pad using uncoated diamond paste with particle sizes of 0.5 µm to 2 µm. Lapping is done for 2 hours at a surface speed of 1200 m/minute. The plates are then polished for 3 hours using an uncoated diamond paste having particle sizes of 0.5 µm to 2 µm.

The low scatter water clear zinc sulfide plates are then inspected using standard fiber optics/fluorescent white light. No discolored material is expected to be observed in the plates.

A sample of the low scatter water-clear zinc sulfide of 2 cm in diameter is cut from each plate using a waterjet. The sample is generated and lapped as described above and then polished to a scratch/dig ratio of 80/50. Polishing is done for 4 hours using a diamond paste with uncoated particles having a size range of 0.25 µm to 1 µm. The samples are measured for transmission in a Shimadzu UV 3101 PC spectrophotometer at a wavelength range of 0.3 µm to 2.5 µm. No degradation in transmission is expected in the visible and near infrared regions of 0.34 µm to 1 µm. A scatterometer assembled by engineers from The Dow Chemical Company and designed to measure forward scatter in the half cone angle of 3 degrees around the incident laser beam of wavelength 632.8 nm is then used to measure the forward scatter @ 0.6328 µm. The results for each sample are expected to be less than 3%/cm.

One plate is further polished to a peak to valley figure plate flatness of $1/8^{th}$ of 632.8 nm and a scratch/dig of 40/20. Polishing is done for 3 hours using the diamond paste having particle sizes of 0.5 µm to 2 µm. It is then measured for wavefront error in transmission and reflection in a Zygo interferometer. From these measurements the refractive index homogeneity is expected to be determined to be less than 5 ppm.

EXAMPLE 2

Magnesium chloride is placed in a retort of a conventional CVD chamber as a solid. The retort is heated to 950° C., to generate gaseous elemental magnesium metal. Vapor pressures range from 8 to 10 Torr.

$AlCl_3$ is placed in a retort of the CVD chamber as a solid. The retort is heated to temperature to 700° C. Vapor pressure for $AlCl_3$ ranges from 5 Torr to 6 Torr.

Elemental oxygen is provided from a source outside the CVD chamber and is pumped into the furnace using conventional apparatus.

Inert argon gas is pumped into the CVD chamber to transport reactants from the retorts to a deposition area where the chuck is placed. On one side of the chamber the spinel precursors and oxygen source are introduced into the deposition area through separate injectors. On the exhaust side a baffle plate is provided to direct reagent flow to the chuck. The flow rate of the argon is from 90 slpm to 100 slpm, the flow rate of the aluminum and the magnesium is 2 slpm to 4 slpm and the flow rate of the oxygen is 3 slpm to 4 slpm. Spinel is deposited on the chuck at a temperature range of 1100° C. to 1200° C. Deposition rate is an average of 5 µm/minute. Deposition continues until 1 mm thick spinel coat is deposited on the chuck.

Five plates of CVD zinc sulfide having dimensions 25 cm×25 cm×1 cm are placed in the chuck one at a time and machined with the Blanchard grinder using a polyurethane resin bonded wheel with cubic boron particles having an average grit size of 230. Machining is done at a rate of 15 KHz for 10 minutes. After machining the zinc sulfide sheets are examined for any pressure marks caused by the chuck. No marks are expected to be seen.

The zinc sulfide sheets are then cleaned in the ultrasonic bath as described in Example 1. Ten platinum foil sheets are procured as described in Example 1. Each foil is then immersed in a 20% aqueous nitric acid solution for 10 minutes at 42° C. The foil sheets are removed from the acid solution and rinsed with deionized water for 2 minutes and then dried with compressed air.

The five zinc sulfide plates are completely wrapped in the ten cleaned platinum foil sheets (two sheets for each plate) and then loaded in a graphite crucible. The crucible with the wrapped zinc sulfide is then placed in a conventional HIP furnace. The crucible containing the wrapped zinc sulfide is HIPped at a temperature of 1000° C. and at a pressure of 20 Ksi for 50 hours in an argon environment to provide low scatter water clear zinc sulfide. After HIPping the crucible is cooled slowly at a rate of 30° C./hour to 60° C./hour. When the wrapped low scatter water clear zinc sulfide plates cool to room temperature, they are removed from the furnace and the plates are unwrapped. They are then generated, lapped and polished to evaluation polish of scratch/dig =120/80 as described in Example 1.

The low scatter water clear zinc sulfide plates are then inspected using standard fiber optics/fluorescent white light. No discolored material is expected to be observed in the plates.

A sample of 2 cm in diameter is prepared from each plate and polished to a scratch/dig ratio of 80/50. Cutting and polishing are done by the same process described in Example 1. The samples are measured for transmission in a Shimadzu UV 3101 PC spectrophotometer. No degradation in transmission is expected in the visible and near infrared regions of 0.34 µm to 1 µm. The scatterometer is then used to measure the forward scatter @ 0.6328 µm. The results for each sample are expected to be less than 3%/cm.

One plate is further polished to a figure of 1/8$^{th}$ wave at 632.8 nm and a scratch/dig of 40/20. Polishing is done as described in Example 1. It is then measured for wavefront error in transmission and reflection in a Zygo interferometer. From these measurements the refractive index homogeneity is expected to be determined to be less than 1 ppm.

EXAMPLE 3

A chuck is first cleaned with 97 wt % acetone and then with 70 wt % methyl alcohol and then mounted in a MicroDyn™ reactive sputtering drum coater. Two sputtering sources and two microwave plasma sources are used simultaneously to deposit alumina on the chuck at a deposition rate of 200 Å/minute. The target material is 99.99% pure aluminum, and it is at a distance of 12 cm from the chuck. The drum upon which the chuck is mounted is rotated at the rate of 1 revolution per second. The coating chamber is pumped down to a pressure of $10^{-6}$ Torr prior to deposition. A mixture of diatomic oxygen and argon are introduced into the deposition chamber. The flow rate of diatomic oxygen and argon, respectively, are 50 sccm and 100 sccm. Total pressure in the chamber is 0.004 Torr. Microwave power is 3 kW with a frequency of 2.54 GHz. Microwaves create plasma near the microwave source.

Before coating, the chuck is exposed to microwave plasma for 5 min. The DC magnetrons are then energized to start the deposition process. The DC pulsed power range is 6 kW and the frequency is 40 kHz. During deposition, microwave plasma is retained to stabilize the target plasmas and to increase coating oxygen consumption. The alumina coating deposition is performed for 25 hrs. The alumina coating on the chuck is 30 μm thick Five plates of CVD zinc sulfide having dimensions 25 cm×25 cm×1 cm are placed in the chuck one at a time and machined with the Blanchard grinder using a polyurethane resin bonded wheel with uncoated diamond particles having an average grit size of 240. Machining is done at a rate of 20 KHz for 5 minutes. After machining the zinc sulfide sheets are examined for any pressure marks caused by the chuck. No marks are expected to be seen.

The cleaning method described in Example 1 is repeated except that the zinc sulfide plates are cleaned with an aqueous solution of sulfuric acid. Each plate is immersed in a 1 mM aqueous solution of sulfuric acid for 5 minutes. The sulfuric acid solution is maintained at room temperature during the cleaning. The plates are removed and rinsed with deionized water for 2 minutes. The plates are then wiped dry with SURE WIPES™. They are then rinsed with high purity acetone for 1 minute and air dried at room temperature.

The zinc sulfide plates are then completely wrapped in cleaned platinum foil and HIPped. After HIPping the zinc sulfide plates are generated, lapped and polished to the evaluation polish of scratch/dig=120/80. The plates are inspected using standard fiber optics/fluorescent white light. No discolored material is expected to be observed on the plates.

A sample of 2 cm in diameter is prepared from each plate and polished to a scratch/dig ratio of 80/50. The samples are measured for transmission in the Shimadzu UV 3101 PC spectrophotometer. No degradation in transmission is expected in the visible and near infrared regions of 0.34 μm to 1 μm. The scatterometer is then used to measure the forward scatter @ 0.6328 μm. The results for each sample are expected to be less than 3%/cm.

One plate is further polished to a figure of 1/8$^{th}$ wave at 632.8 nm and a scratch/dig of 40/20. It is then measured for wavefront error in transmission and reflection in the Zygo interferometer. From these measurements the refractive index homogeneity is expected to be determined to be less than 10 ppm.

EXAMPLE 4

The method described in Example 1 is repeated except that the polishing pads are polyurethane impregnated polyester pads with a porosity of 40% to 50% and a density of 0.3 g/cm$^3$. The zinc sulfide plates are cleaned with an aqueous solution of acetic acid. A 10% aqueous acetic acid solution is prepared from a stock solution of glacial acetic acid (commercially available from LyondellBasell Acetyls, LaPorte, Tex.). Each plate is immersed in the 10% aqueous solution of acetic acid having a pH of 2-3 for 15 minutes. The acetic acid solution is maintained at room temperature during the cleaning. After cleaning the plates are removed and rinsed with deionized water for 2 minutes. The plates are then wiped dry with SURE WIPES™. They are then rinsed with high grade acetone for 1 minute and air dried at room temperature.

The zinc sulfide plates are then completely wrapped in cleaned platinum foil and HIPped. After HIPping the low scatter water clear zinc sulfide plates are generated, lapped and polished to the evaluation polish of scratch/dig=120/80. The plates are inspected using standard fiber optics/fluorescent white light. No discolored material is expected to be observed on the plates.

A sample of 2 cm in diameter is prepared from each plate and polished to a scratch/dig ratio of 80/50. The samples are measured for transmission in the Shimadzu UV 3101 PC spectrophotometer. No degradation in transmission is expected in the visible and near infrared regions of 0.34 μm to 1 μm. The scatterometer is then used to measure the forward scatter @ 0.6328 μm. The results for each sample are expected to be less than 3%/cm.

One plate is further polished to a figure of 1/8$^{th}$ wave at 632.8 nm and a scratch/dig of 40/20. It is then measured for wavefront error in transmission and reflection in the interferometer. From these measurements the refractive index homogeneity is expected to be determined to be less than 5 ppm.

What is claimed is:

1. A method comprises:
   a) Coating, covering or combinations thereof a generating chuck;
   b) placing a zinc sulfide substrate in the coated, covered or combinations thereof generating chuck; and
   c) generating the zinc sulfide substrate in the coated, covered or combinations thereof generating chuck.

2. The method of claim 1, wherein the zinc sulfide substrate is generated with uncoated abrasive particles.

3. The method of claim 2, wherein the uncoated particles are chosen from diamond, silicon carbide, titanium carbide, silicon nitride, tungsten carbide and boron carbide.

4. The method of claim 1, wherein the generating chuck is covered with a polyurethane impregnated polyester pad.

5. The method of claim 1, wherein the generating chuck is coated with one or more ceramic materials.

6. The method of claim 5, wherein the one or more ceramic materials are chosen from nitrides and oxides.

7. The method of claim 5, wherein the generating chuck is coated with one or more ceramic materials by one or more processes chosen from sputtering, chemical vapor deposition, physical vapor deposition, metalorganic chemical vapor deposition and microwave-assisted magnetron sputtering process.

8. The method of claim 1, wherein the generating chuck is coated with one or more non-reactive metals.

9. The method of claim 8, wherein the generating chuck is coated with one or more non-reactive metals by one or more processes chosen from sputtering, chemical vapor deposition, physical vapor deposition, metalorganic chemical vapor deposition and microwave-assisted magnetron sputtering process.

* * * * *